(12) United States Patent
Zhang et al.

(10) Patent No.: US 9,886,050 B2
(45) Date of Patent: Feb. 6, 2018

(54) ADAPTIVE VOLTAGE SOURCE, SHIFT REGISTER AND UNIT THEREOF, AND DISPLAY

(71) Applicant: PEKING UNIVERSITY SHENZHEN GRADUATE SCHOOL, Shenzhen (CN)

(72) Inventors: Shengdong Zhang, Shenzhen (CN); Congwei Liao, Shenzhen (CN); Zhijin Hu, Shenzhen (CN); Wenjie Li, Shenzhen (CN); Junmei Li, Shenzhen (CN)

(73) Assignee: Peking University Shenzhen Graduate School, Shenzhen, Guangdong (CN)

( * ) Notice: Subject to any disclaimer, the term of this patent is extended or adjusted under 35 U.S.C. 154(b) by 0 days.

(21) Appl. No.: 15/126,929

(22) PCT Filed: Nov. 14, 2014

(86) PCT No.: PCT/CN2014/091123
§ 371 (c)(1),
(2) Date: Sep. 16, 2016

(87) PCT Pub. No.: WO2015/172542
PCT Pub. Date: Nov. 19, 2015

(65) Prior Publication Data
US 2017/0097650 A1    Apr. 6, 2017

(30) Foreign Application Priority Data
May 12, 2014 (CN) .......................... 2014 1 0197747

(51) Int. Cl.
*G09G 3/20* (2006.01)
*G05F 1/625* (2006.01)
*G11C 19/18* (2006.01)

(52) U.S. Cl.
CPC ........... *G05F 1/625* (2013.01); *G09G 3/2092* (2013.01); *G11C 19/184* (2013.01);
(Continued)

(58) Field of Classification Search
CPC ..................... G09G 3/2092; G09G 2310/0286
See application file for complete search history.

(56) References Cited

U.S. PATENT DOCUMENTS 5,701,136 A * 12/1997 Huq ..................... G09G 3/3677
345/100
7,091,945 B2   8/2006 Yamazaki
(Continued)

FOREIGN PATENT DOCUMENTS

| CN | 101359440 A | 2/2009 |
| CN | 102435859 A | 5/2012 |

(Continued)

OTHER PUBLICATIONS

English Translation from WIPO of PCT International Written Opinion from PCT/CN2014/091123 dated Feb. 13, 2015.
(Continued)

*Primary Examiner* — Kevin M Nguyen
(74) *Attorney, Agent, or Firm* — Ladas & Parry, LLP

(57) ABSTRACT

An adaptive voltage source, comprising a signal output end, and a reference resistance forming circuit and a sensing module connected in series between a voltage source and a low power level; the sensing module comprises a sensing end coupled to a transistor to be sensed to sense the threshold voltage drift of the transistor to be sensed in a device circuit; the equivalent resistance of the sensing module increases with the increase of the sensed threshold voltage drift; and the signal output end is coupled to a first node coupled to the reference resistance forming circuit and the sensing module, and is used to output adaptive voltage.

(Continued)

The output adaptive voltage is adjusted via the threshold voltage drift sensed by the sensing module. Based on the circuit, also disclosed are a shift register and unit thereof, and display.

15 Claims, 7 Drawing Sheets

(52) U.S. Cl.
CPC ............... *G09G 2310/0267* (2013.01); *G09G 2310/0275* (2013.01); *G09G 2310/0286* (2013.01); *G09G 2310/0289* (2013.01); *G09G 2310/08* (2013.01); *G09G 2330/021* (2013.01)

(56) References Cited

U.S. PATENT DOCUMENTS

2008/0273002 A1   11/2008  Kim et al.
2010/0188385 A1*  7/2010  Boiko .................. G09G 3/3677
                                                345/211
2011/0292007 A1*  12/2011  Ohhashi ................ G11C 19/28
                                                345/204
2014/0091996 A1*  4/2014  Moon .................. G09G 3/3685
                                                 345/92
2014/0091997 A1*  4/2014  Han ..................... G09G 3/3677
                                                 345/92

FOREIGN PATENT DOCUMENTS

CN               203261550 U      10/2013
KR              20080097620      11/2008

OTHER PUBLICATIONS

PCT International Preliminary Report on Patentability Chapter I from PCT/CN2014/091123 dated Nov. 15, 2014, and its English translation from WIPO.
International Search Report for PCT/CN2014/091123 dated on Feb. 13, 2015 and its English translation provided by WIPO.
Written Opinion of the International Search Authority for PCT/CN2014/091123 dated on Feb. 13, 2015 and its English translation provided by Google Translate.

* cited by examiner

ADAPTIVE VOLTAGE SOURCE, SHIFT REGISTER AND UNIT THEREOF, AND DISPLAY

CROSS-REFERENCE TO RELATED APPLICATIONS

This application is the U.S. National Stage of International Patent Application No. PCT/CN2014/091123 filed on Nov. 14, 2014, which claims priority to Chinese Patent Application 201410197747.0 filed on May 12, 2014, the disclosures of which are hereby incorporated by reference in their entireties.

TECHNICAL FIELD

The present disclosure relates to the field of electronic circuits, in particular to an adaptive voltage source, shift register and unit, and display.

BACKGROUND

In recent years, with rapid development, the narrow bezel display technology is gradually becoming the mainstream of flat panel display technology. The narrow bezel display technology is widely used in small or medium size flat panel display with thin film transistor, such as smart phones and tablets. TFT integrated driver circuit (Gate-driver on Array, GOA) design is essential for realizing narrow bezel display. With adopting of GOA circuit, not only the TFT display panel becomes compact due to significant decrease of bezel size of the display, but also the number of source and gate driving chip and the related connections be reduced. In addition, the following module and packaging process can also be reduced. Consequently, the manufacturing cost of the display can be greatly reduced, and the reliability of the TFT display panel can also be improved. In additions, restricting of leading pads' pitch on implementation of high-resolution displays can be relieved as number of external connections can be decreased obviously.

With the promotion of the smart home concept, the demand of large size TV panel with high-resolution and high performance is increasing. Thus the design of GOA circuit suitable for high performance TV panel becomes urgently needed. Therefore, the study of new GOA circuit for TFT industry is of great significance, which is not only because the TV panel is the key point of TFT industry development, but also we have a greater advantage to accumulate new intellectual property in this field. The most concerned issue of GOA design for TV panel is reliability. Different with small size display panel, the operating frequency of TV panels is much higher, and the product lifetime is required to be longer.

However, there are many problems in realization high-performance GOA with high reliability. One of the most important challenges for GOA design is the threshold voltage shift of TFT due to the gate bias stress. In the past ten years, the main method to improve GOA reliability is by compensating the deficiency of the TFT device characteristics. But generally speaking, up to date, only TFT device are concerned, and methods of suppressing shift of electrical characteristics are proposed.

In a variety of previous GOA circuits, constant gate biasing mode is popularly used for the low level holding TFTs. However, according to the GOA circuit operating principle, constant-biasing method leads to the low-level-holding TFTs biasing with high gate voltage with unnecessarily long operating time, thus the threshold voltage shift of TFT is large and the life of the circuit is difficult to be prolonged. As showed in the FIG. 12, almost all the GOA circuits comprise 3 basic modules: input, output and low-level-holding module. The T100 is input device; the T200 is output device, which outputs the line scan pulse signal; the T300 and T400 are low level holding devices, whose gate input voltage is high as a constant value. There are usually overlap capacitance between the gate electrode and the source-drain electrode, as $C_{GD}$ of T200 as showed in FIG. 12. During the low level holding period, when clock signal of the T200 drain switches from low level to high level, the voltage potential of gate electrode of T200, which is originally at the low level, will rise due to the coupling of $C_{GD}$. If the feed-through induced voltage-rising trend cannot be well suppressed, T200 will switch to the sub threshold region or even the on region, which will lead to a very large charging current at the output electrode and the output cannot be maintained low. At this time, T300 and T400 are turned on, and the gate of T200 and output electrode can be pulled-down, respectively. But one of the main problems is that the threshold voltage of TFTs is prone to increases with the time under the electric stress, which leads to the degradation of the conducting ability. When the threshold voltage increases from the initial value (such as $V_{TH0}$) to a certain critical value (such as $V_{THC}$), T300 and T400 is no longer being able to maintain the low level of gate electrode of T200 and the output, and the circuit starts to malfunction.

According to the operation principle of the mentioned GOA circuit, for normal operating, the gate-to-source over-drive voltage (the difference between the gate-source voltage and the threshold voltage) of T300 and T400 is required to be slightly larger than the difference ($V_{THC}-V_{GL}-V_{GH}$). Here the $V_{GH}$ and $V_{GL}$ represents high/low level of clock signal, respectively, for driving T300 and T400. But in previous GOA circuits, the level of the driving clock signal of the low level holding device is constant. Thus for most of the time, especially for early operating time, over-drive voltage of T300 and T400 is much greater than the difference ($V_{GH}-V_{THC}-V_{GL}-$). For example, $V_{GH}$, $V_{THC}$, $V_{TH0}$ and $V_{GL}$ are 25V, 20V, 3V, and 0V, respectively. In the early stage of the circuit operating, the required gate over-drive voltage of T300 and T400 is only 5 V, but the actual value of the over-drive voltage ($V_{GH}-V_{TH0}-V_{GL}$) reaches 22 V. Both theoretical and experimental results show that the shift of the threshold voltage accelerates due to the increase of the driving voltage. To sum up, due to the constant biasing method, in the previous GOA circuits, the high level of the clock signal is constant, threshold voltage of relevant TFTs shift too fast and circuit life is difficult to be prolonged.

SUMMARY

This disclosure provides an adaptive voltage source, shift register and its unit and a display device, so as to sense of the threshold voltage shift of sensing transistor, and regulate the supply voltage.

According to the first aspect of the present disclosure, an adaptive voltage source is provided in an implementation mode, comprising: the reference resistor forming module and the sensing module, and the reference resistor forming module is cascaded between the voltage source and the low level. Among them, the sensing module includes sensing port, which is coupled with the sensing transistor, and the threshold voltage shift of the sensing transistor is extracted. The equivalent resistance of the sensing module increases due to the increase of threshold voltage.

Signal output terminal is connected with the first node, and the first node is positioned between the reference resistance forming circuit and the sensing module. And adaptive voltage is supplied to equipment circuit.

According to the second aspect of the present disclosure, a shift register is provided, which includes at least one shift register unit, isolation part and the mentioned adaptive voltage source. Here shift register unit includes driving part, which is used to transfer the first signal to the output terminal through states switching, and then output the required scanning signal.

Input module is used to control the switch status of the drive module.

Low-level-holding module can maintain the output terminal of driver module at low level by the states switching. And the low-level-holding module is activated after the scanning pulses are generated by the shift register units.

The sensing terminal of adaptive voltage source is coupled with the enable terminal of low level holding module. And signal output electrode, isolation module and enable terminal of low level holding module are connected in series.

The threshold voltage of the low-level-holding module can be sensed by the adaptive voltage source. And the supply voltage of enable terminal in the low-level-holding module can be adjusted by the threshold voltage of the low-level-holding module.

According to the third aspect of the present disclosure, a display device is provided.

A two-dimensional pixel array is composed of plurality of pixels, data lines in a first direction connected with each pixel in the array, and scanning lines of the second direction.

Data signals are provided to data lines by data driving circuits.

Gate driving signal is provided to gate scanning lines by gate driving circuit. And gate driving circuits is composed of the above mentioned shift registers.

In the adaptive voltage source proposed in this disclosure, the threshold voltage of the sensing module varies in accordance with that of the pull-down transistor. Thus, the equivalent resistance of the sensing module varies with threshold voltage of pull-down TFT. In the case that the reference resistance is constant, the output terminal of the adaptive voltage source is in proportion to the equivalent resistance of the sensing module. Thus the applied voltage at the loading device can be adjusted accordingly.

In the shift register proposed in this disclosure, the threshold voltage shift of the low level holding module can be detected by an adaptive voltage source. And the supplied voltage for low-level-holding module can be adjusted in accordance with the sensed threshold voltage. Consequently, the threshold voltage shift speed can be slowed down, and the lifetime of the gate driver can be prolonged.

CONCRETE IMPLEMENTATION METHOD

In order to clearly illustrate the purpose, the technical scheme and the merits of the present disclosure, a detailed description of the disclosure is given combined with concrete implementation as shown in the diagrams.

First, some terms is explained. And in this disclosure, the following mentioned switching tubes refers to transistors.

The transistors in this disclosure may be bipolar junction transistors or field effect transistors. When the transistor is bipolar junction transistor, the control electrode is the base electrode, and the first electrode can be collector or emitter electrode of bipolar junction transistor, and the second electrode corresponding is emitter or collector electrode of bipolar junction transistor. In the case of field effect transistor, the control electrode is gate electrode, and the first electrode is drain electrode or source electrode, correspondingly the second electrode is source electrode or drain electrode. In display application, typically a field effect transistor is used, that is thin film transistor (TFT). A detailed description of the disclosure is given, and the field effect transistor is taken as an example, in other embodiments, the transistor may also be bipolar junction transistor.

Overlapping means that, there is specific time at least, two signals are both at the effective voltage level. Thus non-overlapping means that two signals are not at the effective voltage level in any time.

Figure 1:
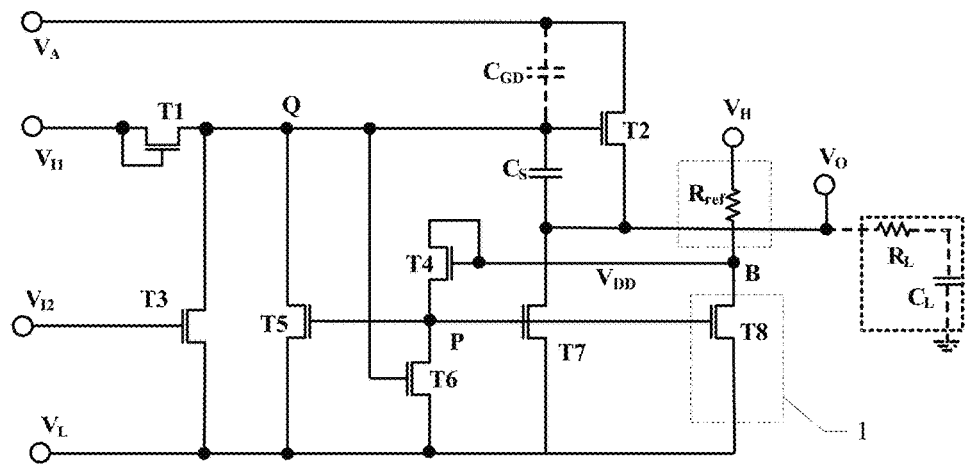
FIG. 1 shows concept diagram of the circuit schematic of this disclosure.

As shown in FIG. 1, the shift-register unit is taken an example to illustrate the thoughts of the present disclosure. The logical function of the conventional shift register unit is realized by T1~T7. In the low level holding phase, after the enabling signals are received by T5 and T7, the output terminal and control terminal Q can be pulled down to the low level, i.e. $V_L$. Usually the enable signal of low-level-holding module (i.e. P) is high level (provided by VDD). Thus there is threshold voltage shift in the case that T5 and T7 are biased with high voltage for long operating time. When T5 and T7's threshold voltage shift, the level of enable signal of the low level holding module should be adjusted accordingly, so as to maintain the low level of output terminal and control terminal Q of the shift register unit. As there is a positive relation with the equivalent resistance of the transistor and the threshold voltage (the greater the threshold voltage, the greater the resistance), a feasible method is to serially connect reference resistor $R_{ref}$ and the sensing TFT (as FIG. 1 shows the T8). Assuming the resistance of T8 is $R_{T8}$, the enable signal $V_{DD}$ provided to low level holding terminal P can be expressed as $$\frac{R_{T8}}{R_{T8} + R_{ref}} V_H.$$

As the threshold voltage of T5 and/or T7 is sensed by T8 and the equivalent resistance value of T8 $R_{T8}$ can be modulated accordingly, the $V_{DD}$ can be adjusted accordingly.

Figure 2:
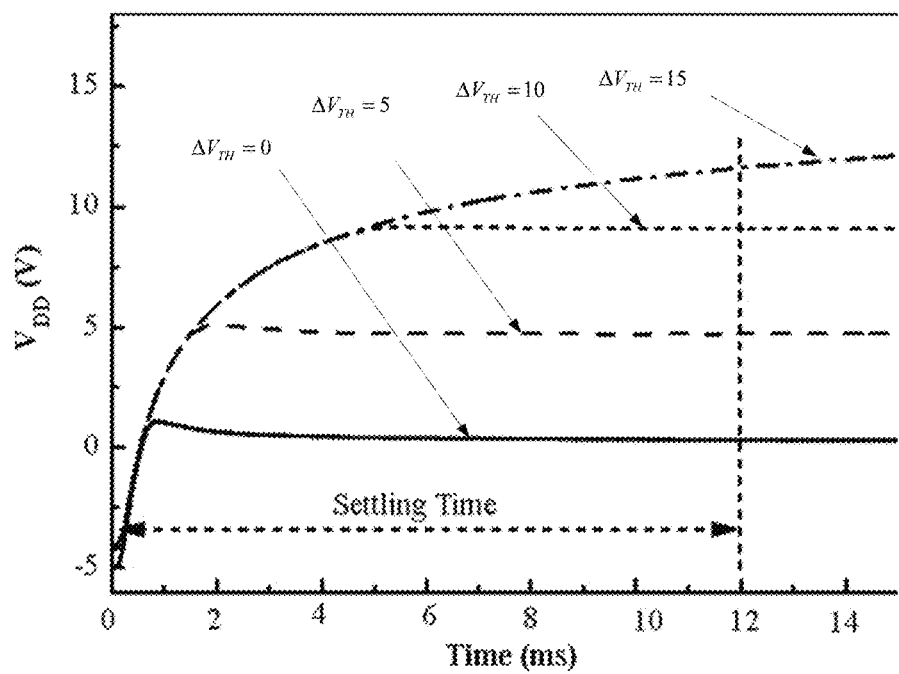
FIG. 2 shows the SPICE simulation results of the proposed schematic.

In order to verify the mentioned schematic, the SPICE simulation is carried out using IGZO TFT (indium gallium oxide thin film transistor) model, and the IGZO TFT model is extracted according to the measurement results. It is proved that in the case the shift of threshold voltage of T8 follows that hat of T5 and T7, the output amplitude of the voltage $V_{DD}$ can be adjusted adaptively with operating time. FIG. 2 show the transient response of output voltage $V_{DD}$ with $V_{TH}$ shift of 0V, 5V, 10V and 15V, accordingly. According to the simulation results, the increase of the settled $V_{DD}$ is approximately equal to the increase of $V_{TH}$ shift. Although a certain settling time (~12 ms) is required for the stable of $V_{DD}$, for continuous operating of the display equipments, the settling time is still within the acceptable range. As a result, the simulation results of FIG. 2 confirm that the idea of threshold voltage sensing and feedback method is correct.

Based on the above mentioned schematic, as shown in FIG. 1, an adaptable voltage source is disclosed, which include reference resistor forming circuit and sensing module 1.

The reference resistance forming circuit and the sensing module 1 are connected in series between the voltage source $V_H$ and the low level.

The sensing module 1 includes a sensing terminal. The sensing terminal is coupled with Tx of the sensing transistor, and it is used to sense the threshold voltage of Tx. The equivalent resistance of the sensing module 1 will increases with the increase of $V_{TH}$.

Signal output terminal is connected with the first node B, where the reference-resistance forming circuit is coupled to the sensing module, and adaptive voltage $V_{DD}$ can be provided through the signal output terminal to the external equipment circuits.

According to an embodiment, $R_{ref}$ is realized by a reference-resistance-forming module. One end of $R_{ref}$ is coupled with $V_H$, and the other end is coupled to the node B. As $V_{DD}$ and $R_{ref}$ are closely related, and $R_{ref}$ is measuring reference resistance, so how to keep the value of $R_{ref}$ constant is essential. Theoretically speaking, $R_{ref}$ can be realized by the TFT process. However, in the existing oxide TFT process, the manufacturing process of resistor for integrated circuits is not mature. In additions, there are oxygen vacancies in oxide semiconductor, which leads to decrease of resistivity. Thus the oxide semiconductor resistance occupies a larger area. On the other hand, the oxide semiconductor resistance is easily degraded like TFTs, thus the precision of the adaptive voltage reference source is affected. The oxide TFT process is difficult to integrate constant $R_{ref}$, therefore, a circuit that can achieve constant resistance is needed. The specific implementation is described with concrete examples.

First Embodiment

Figure 3:
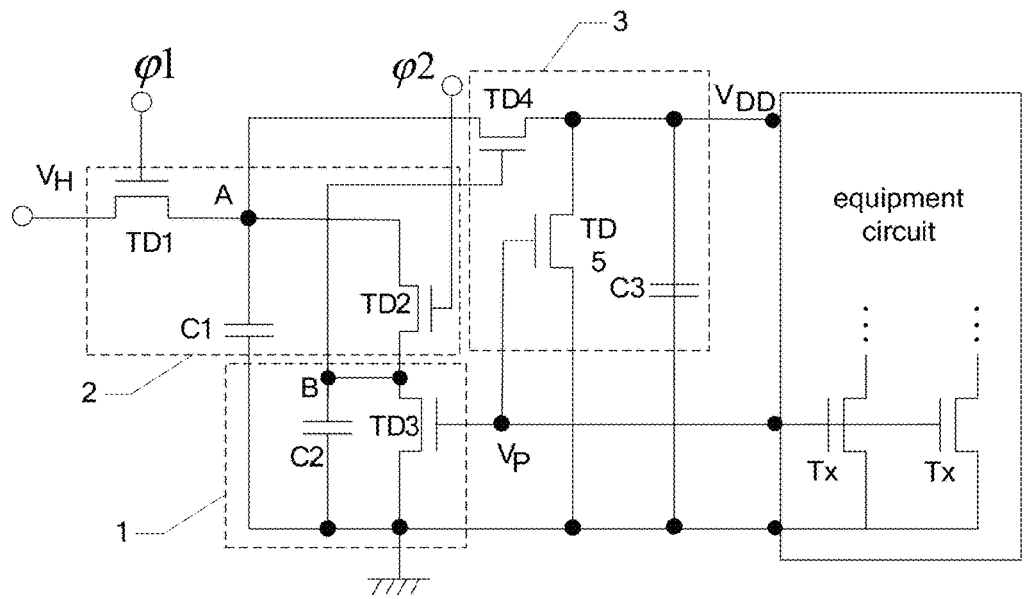
FIG. 3 shows the first embodiment of the structure diagram for the first example of adaptive voltage source.

FIG. 3 shows the adaptive voltage source structure. The adaptive voltage source structure includes a sensing module 1 and a reference resistance forming circuit, in which the reference resistance forming circuit and the sensing module 1 are connected in series between the voltage source $V_H$ and the low level. The sensing unit TD3 is included in the sensing module 1, and TD3 is chosen as triode as preferred. In other embodiments, TD3 can also realized by diodes, or other types of transistor, or it can be realized by connecting or coupling by other transistors which have the same function as triode. In this embodiment, the control electrode (i.e. gate) of the sensing unit TD3 is the sensing terminal of the sensing module 1, which is coupled with sensing transistor Tx. And the threshold voltage shift of Tx can be sensed by TD3.

Figure 4:
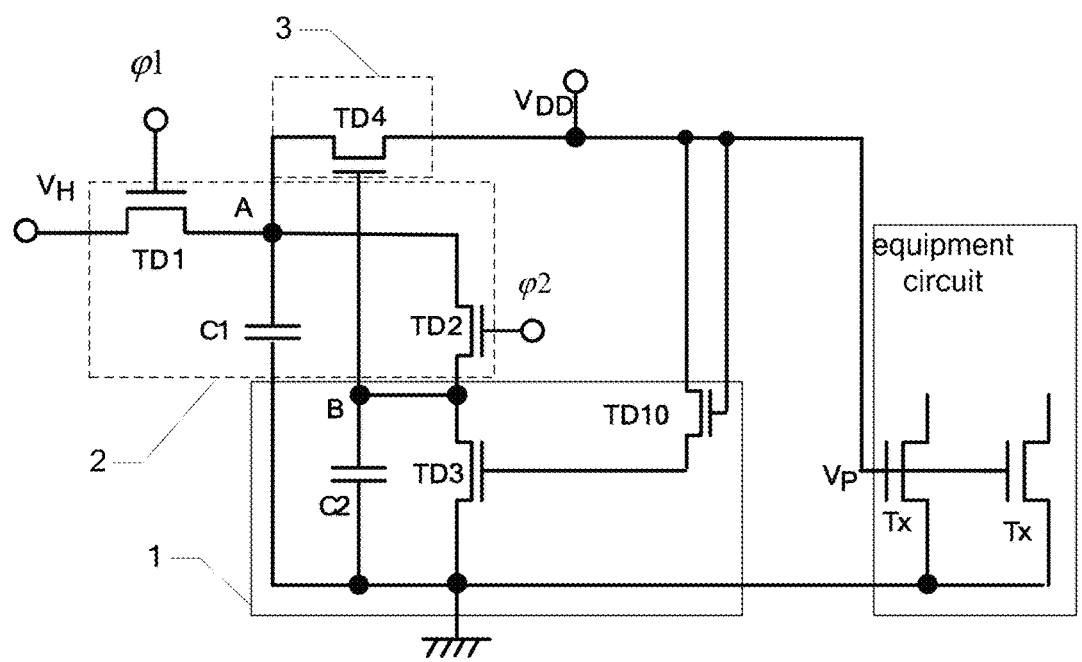
FIG. 4 shows the second embodiment of the structure diagram for the first adaptive voltage source.

According to an embodiment, the control electrode (for example, gate) of the sensing unit TD3 is coupled to the control electrode (for example, gate) of the sensing transistor Tx. The first electrode (for example, gate) of the sensing unit TD3 is coupled with the first node, and the second electrode (for example, gate) is coupled with low level terminal. In addition, the sensing module 1 also contains the tenth switch transistor TD10. And TD10 is chosen as triode as preferred. As shown in FIG. 4, the control electrode (for example, gate) of the sensing unit TD3 is coupled with the second electrode (for example, gate) of the tenth switch transistor TD10. The control electrode (for example, gate) of the tenth switch tube TD10 and the first electrode (for example, gate) are connected together, and both the control and the first electrode of TD10 are coupled with the control electrode (for example, gate) of the sensing transistor Tx. At the same time, the threshold voltage shift of the sensing transistor Tx can be sensed by the sensing unit TD3 in accordance with the switching state of TD10.

It needs to be explained that, the equipment circuits means the circuits that require the adaptive voltage source for threshold voltage sensing. And the equipment circuits can be gate drive circuit, pixel circuit and operational amplifier circuit, etc. In addition, sensing transistor Tx means the transistor whose threshold voltage shifts in equipment circuits. It needs to be explained that, in other embodiments, the sensing module can also sense the threshold voltage shift of multiple sensing transistors Tx at the same time, thus the control electrode (for example, gate) of multiple sensing transistors Tx should be placed in parallel to the sensing terminal of sensing module 1.

Figure 5:
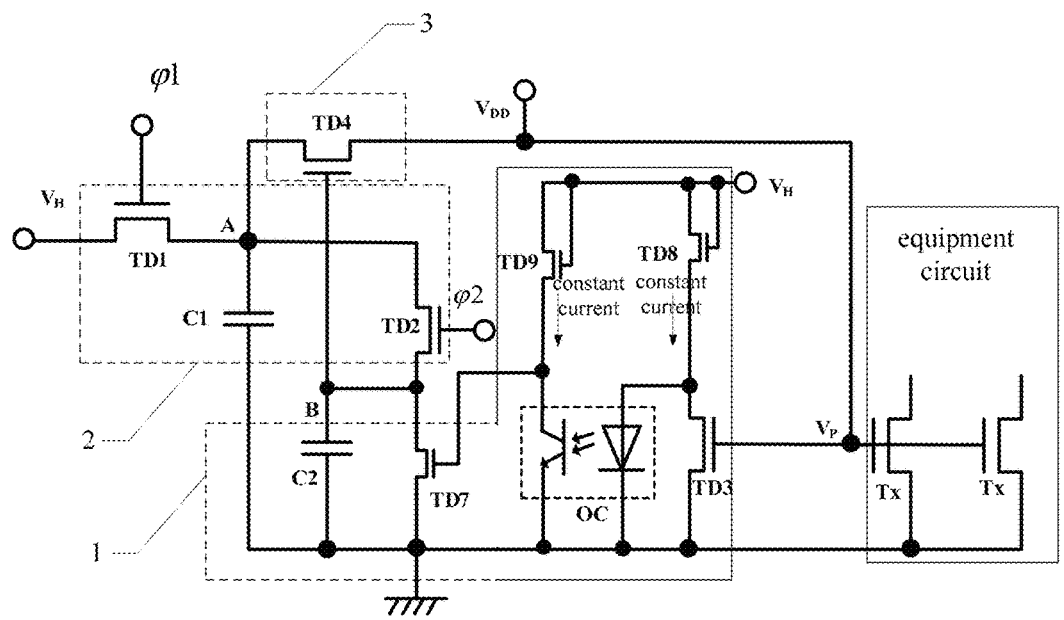
FIG. 5 shows the third embodiment of the structure diagram for the first adaptive voltage source.

In another embodiment, as shown in FIG. 5, the sensing module 1 comprises the sensing unit TD3, optical coupler (for example, TLP521-1), seventh TD7 switch tube TD7 (preferably to triode), the first constant current source and the second constant current source. The control electrode (for example, gate) of the sensing unit TD3 is the sensing terminal of the sensing module 1 which is coupled with the sensing transistor Tx and the threshold voltage shift of Tx can be sensed. The first electrode (for example, drain) of the sensing unit TD3 and the first terminal of the optical coupler OC are connected, and they are coupled with the first constant current source. The second electrode (for example, source) of the sensing unit TD3 and the second terminal of the optical coupler OC are coupled to the low level terminal. In addition, the fourth electrode of the optical coupler OC and the control electrode (for example, gate) of the seventh switch transistor TD7 are connected, and they are coupled to the second constant current source. The third terminal of the optical coupler OC and the second electrode (for example, sources) of the seventh switch transistor TD7 are coupled to low level terminal, and the first electrode (for example, drain) of the seventh switch transistor TD7 is coupled with the first node B. In one embodiment, the first constant current source includes the eighth switch transistor TD8 (triode is chosen as preferred). The first electrode (for example, drain of the eighth switch transistor TD8 and control electrode (for example, gate) are coupled with the high level terminal. At the same time, the second electrode (for example, source) of the eighth switch transistor TD8 are coupled with the first electrode (for example, drain) of the sensing unit TD3 and the first terminal of the optical coupler OC. The second constant current source includes the ninth switch transistor TD9. The first electrode (for example, drain) of the ninth switch transistor TD9 and control electrode (for example, source) are coupled to the high level terminal, and the second electrode (for example, source) is coupled to the fourth terminal of the optical coupler OC and the control electrode (for example, gate) of the seventh switch transistor TD7. In the presented embodiment, when the threshold voltage of the sensing transistor Tx is increased, the conduction ability of sensing unit TD3 is decreased. In the case that the output current of the first constant current source is constant, in the optical coupler, there is more current flow from the first to the second terminal. Then the pull-down current flow of the optical coupler is increased, and the voltage of the control electrode (i.e. gate) of the seventh switch transistor TD7 is pulled down, thus the conduction ability of the seventh switch transistor TD7 is decreased. Thus the voltage of the first electrode B is raised. Therefore adaptive voltage $V_{DD}$ at the signal output terminal can be raised correspondingly.

In the optimization embodiment, the sensing module 1 also includes the second storage capacitor C2. The second storage capacitor C2 is placed in parallel between the first node B and the second electrode (i.e. source electrode) of sensing unit (TD3).

It needs to be explained that, the reference resistor forming circuit can be realized by the switching module 2. Switching module 2 includes the first switch transistor TD1, the second switch transistor TD2 and the first storage capacitor C1. The control electrode (for example, gate) of the first switch transistor TD1 is used for receiving the first clock signal φ1. In which the first electrode (for example, drain) is used for receiving voltage source $V_H$ and the second electrode (for example, source) is coupled with the first electrode (for example, drain) of the second switch transistor TD2 to form the second node A. The control electrode (for example, gate) of the second switch transistor TD2 is used for receiving the second clock signal φ2 and the second electrode (for example, source) is coupled to the first node B. At the same time, one end of the first storage capacitor C1 is coupled with the second node A and the other end is coupled to the low level terminal.

The voltage source $V_H$ is transferred to the second node A through the first switch transistor TD1, corresponding to the effective voltage level of the first clock signal φ1. The first node B is coupled to the second node A through the second switch transistor TD2, corresponding to the active level of the second clock signal φ2. In addition, the effective voltage level time for the first clock signal φ1 and the second clock signal φ2 are non-overlapped. In presented embodiment, the effective voltage level is high voltage. In others embodiment, the effective voltage level can also be others levels which can be used to turn on the first switch transistor TD1 or the second switch transistor TD2. In an optimization embodiment, the first clock signal φ1 and the second clock signal φ2 have the same clock cycle T.

Furthermore, the adaptive voltage source also includes an adjustment module 3, which is coupled between the second node A and the signal output terminal. In particular, the adjustment module 3 includes the fourth switch transistor TD4. The first electrode (i.e. drain) of the fourth switch transistor TD4 is coupled to the second node A, and the second electrode (i.e. source) is coupled to the signal output terminal, which is used as the output electrode for the adaptive voltage $V_{DD}$. In addition, the control electrode (i.e. gate) of the fourth switch transistor TD4 is coupled to the second node A or the first node B. In the optimized embodiment, the control electrode (i.e. gate) of the fourth switch transistor TD4 is coupled to the first node B.

In another specific embodiment, the adjustment module 3 may also includes the fifth switch transistor TD5. The control electrode (i.e. gate) of the fifth switch transistor TD5 is coupled to the sensing terminal of the sensing module 1, and the first electrode is (i.e. drain) coupled to the signal output terminal, what's more, the second electrode is coupled to the low voltage level terminal.

In order to realize the noise filter of output adaptive voltage $V_{DD}$ at the signal output terminal, in an embodiment, a filter capacitor C3 is also included in the adjustment module 3. One end of the filter capacitor C3 is coupled to the signal output terminal, and the other end is coupled to the low level.

Figure 6:
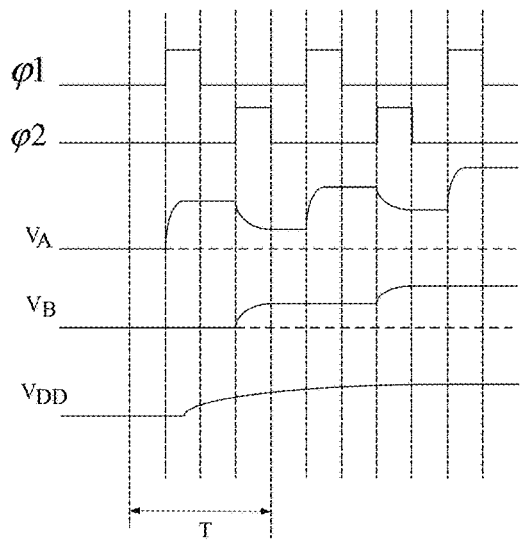
FIG. 6 shows the timing diagram for the operating of the first adaptive voltage source.

The operating time for the adaptive voltage source is show in FIG. 6. It needs to be explained that, when there is non-overlapping clock in equipment circuits, the first clock signal and the second clock signal can be generated by any non-overlapping clock signals in equipment circuits. The operating principal of the adaptive voltage source is described in accompany with FIG. 3, FIG. 4 and FIG. 6.

During the low level period for the second clock signal φ2, the second switch transistor TD2 is not turned on. Therefore, the second node A and the first node B are isolated. If the level of first clock signal φ1 is high, then the first switch transistor TD1 will be turned on. Thus charging current can be provided by the external voltage source $V_H$ through the first switch transistor TD1, and the second node A will be charged. Consequently, charge can be accumulated on the first capacitor C1, and the voltage of the second node A $V_A$ will be raised. When the first clock signal switch from high level to low level, the first switch transistor TD1 is turned off, and the charging process of the second node A will be terminated and the level of $V_A$ can be maintained. It needs to be explained that, limited by the resistance of the first switch transistor TD1 and the first storage capacitor C1, and also due to the short time of the first clock signal φ1 at high level, the voltage of the second node A $V_A$ can't reach the exact value of $V_H$ of the external voltage source. It also needs to be explained that, the sensing unit TD3 coupled to the equipment circuits might be in a weak conducting state. But the first node B can almost maintain the original level state due to the charge retention of the second storage capacitor C2.

During the low level period of the first clock signal φ1, if the second clock signal φ2 is also with low level, then both the first switch transistor TD1 and the second switch TD2 transistor are not turned on, and the voltage of the second electrode A $V_A$ and the voltage of first electrode B $V_B$ is maintained. Otherwise, during the low level period of the first clock signal φ1, if the second clock signal φ2 is with high level, then the second switch transistor TD2 can be turned on. So the second node A and the first node B are coupled together through the second switch transistor TD2. Thus there is charge sharing between the first storage capacitor C1 and the second storage capacitor C2, and the level of $V_A$ is decreased and the level of $V_B$ is raised. In other words, some of the charges are transferred from the first storage capacitor C1 to the second storage capacitor C2.

Since there is no high-level overlapping time for the first clock signal φ1 and the second clock signal φ2, the second node A is firstly charged by the voltage source $V_H$ during a clock cycle T, and then the second node A is coupled with the first node B, which renders the charge sharing between the first storage capacitor C1 and the second storage capacitor C2. It needs to be explained that, the arrival sequence for the high level of the first clock signal φ1 and the second clock signal φ2 are not required to be specified. In other embodiments, if the high level arrival time of the second clock signal φ2 is earlier than that of the first clock signal φ1, then the second node A is coupled to the first node B firstly, which renders the charge sharing between the first storage capacitor C1 and the second storage capacitor C2, and the second node A is charged by the voltage source $V_H$ secondly.

After several clock periods T, the level of the second node A $V_A$ and the level of the node B $V_B$ gradually becomes the same value as $V_{AB}$. The value of $V_{AB}$ is closely related with the equivalent resistance of the switch module 1. (And the switch module 1 consists of the first storage capacitor C1, the first switch transistor TD1, the second switch transistor TD2 and the sensing unit TD3). It can be expressed that, $$V_{AB} \propto \frac{R_{EQ}}{R_{EQ} + R_{12}},$$

and $R_{EQ}$ is the equivalent resistance of the sensing unit TD3, and $R_{12}$ is the equivalent resistance of the switch module 1. Since the output terminal of signal is coupled to the second node A, $V_{DD}=V_A$, after several clock periods, $$V_{DD} = V_{AB} \propto \frac{R_{EQ}}{R_{EQ} + R_{12}}.$$

In the presented embodiment:

$$V_{DD} = V_{AB} = V_H \frac{R_{EQ}}{R_{EQ} + R_{12}} \quad (1)$$

and the equivalent resistance of the switch module 1 can be approximately expressed as $$R_{12} = \frac{V_H - V_B}{\frac{C1(V_H - V_B)}{T}} = \frac{T}{C1} \quad (2)$$

As is shown in Formula (2), the equivalent resistance $R_{12}$ of the switch module 1 is determined by the ratio of the clock period T and the first storage capacitor C1, and it is not independent of the threshold voltage or the mobility of the first switch transistor TD1 and the second switch transistor TD2. Even though there is degradation of the first switch transistor TD1 or second switch transistor TD2, as long as they have a certain conducting ability, the accuracy of the value of the equivalent resistance $R_{12}$ can still be maintained. Thus $R_{12}$ is almost independent of the electrical characteristics of the transistor. Thus, due to the increase of threshold voltage of the sensing unit TD3, the equivalent resistance of $R_{EQ}$ is increased. Therefore, according to the formula (1), the voltage $V_{AB}$, which equals the adaptive voltage $V_{DD}$, will be increased as a result. And the accuracy of the adaptive voltage source can be improved.

It needs to be explained that, the main function of the modulation module 4 is:

on one hand, module 4 is used to modulate the output adaptive voltage $V_{DD}$. In the case that the threshold voltage of the sensing unit TD3 is low, the equivalent resistance $R_{EQ}$ of the sensing unit TD3 is small. So the average potential $V_B$ of the first node B is low and the conductibility of the fourth switch transistor TD4 is weak, thus the provided adaptive voltage $V_{DD}$ is decreased. In the case that the threshold voltage of the sensing unit TD3 is large, the pull-down ability through the sensing unit TD3 is weakened, thus the provided adaptive voltage $V_{DD}$ can be increased. In an optimized embodiment, the control electrode of the fourth switch transistor TD4 (i.e. gate) should be coupled to the first node B. Similarly, in another embodiment, the fifth switch transistor TD5 also plays a similar modulating role.

On the other hand, according to a specific embodiment, the modulation module 4 can also filter noise in the adaptive voltage $V_{DD}$ through the filtering capacitor C3.

In this embodiment, constant equivalent resistance $R_{12}$ can be realized though switch module 2. And the equivalent resistance $R_{12}$ is required in the reference resistance forming circuit. Based on the positive relationship between the equivalent resistance $R_{EQ}$ and its threshold voltage of the transistor, the threshold voltage of the transistor in equipment circuits can be sensed by the sensing unit TD3, so the voltage division of $V_H$ can be adjusted according to threshold voltage shift of transistors in equipment circuits. Thus the provided adaptive voltage $V_{DD}$ to the equipment circuits can be adjusted.

Second Embodiment

Figure 7:
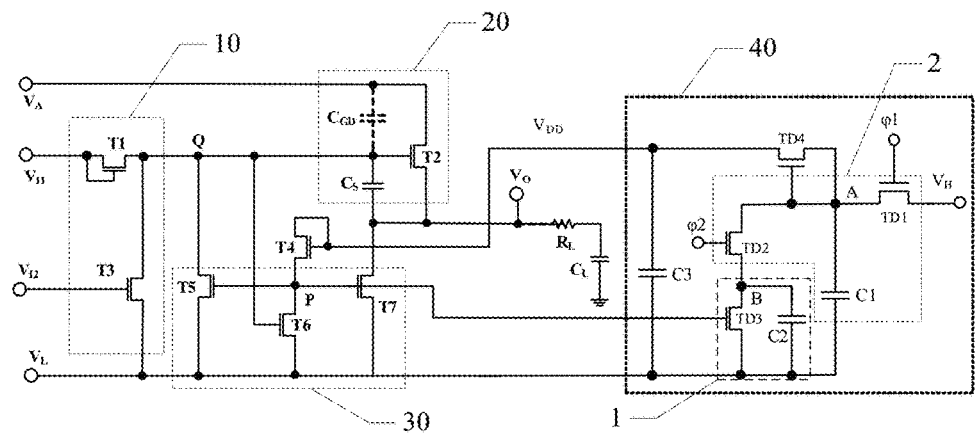
FIG. 7 shows the structure diagram of shift register unit circuit of the second examples of this disclosure.

The adaptive voltage source disclosed by the first embodiment can be applied to any equipment circuits that are based the supplied voltage, which can be modulated by the threshold voltage of the transistors. Here the shift register unit is taken as an example for explanation. The circuit structure of shift register unit is shown in FIG. 7. The shift register unit includes a drive module 20, an input module 10, a low level holding module 30 and an adaptive voltage source 40. Among them, The driver module 20 is used for transmitting the first signal $V_A$ to the signal output terminal of the shift register unit according to the switching state, and then outputs scanning signal is provided. After the driving voltage is provided to the driver control terminal Q, the first signal $V_A$ is transmitted to the signal output terminal of the shift register unit. In a specific embodiment, the driver module 20 may includes the second transistor T2 which is coupled to signal output terminal of the shift register unit and the capacitor Cs for storing charge of the drive control terminal Q. In other embodiments, other driving methods can also be included.

The input module 10 is used to control the switch states of the drive module 20. For example, in the input module 10, the first pulse signal $V_{I1}$ is transferred from the first pulse signal input terminal, and driving voltage is provided for the control terminal Q of the drive module 20. And also in the input module 10, to receive the second pulse signal $V_{I2}$ can be provided to the second pulse signal input terminal. In addition, the signal output terminal of the shift register unit and the driver control terminal Q are coupled to the low level terminal. In a specific embodiment, an input module 10 may includes the first transistor T1 for receiving the first pulse signal $V_{I1}$ and the third transistor T3 for receiving the second pulse signal $V_{I2}$. In the other embodiments, there are also other methods to realize the input module.

The low level holding module 30 is used to maintain the signal output of the driver module 20 at a low level after scan signal is generated by the shift register unit by taking advantage of switching state. In the case that enable terminal for low-level-holding module, i.e. terminal P, gets the enable signal $V_P$, the signal output terminal of the shift register unit and drive control terminal Q are coupled to the low level. In this embodiment, the effective level for the enable signal is a high level. In a specific embodiment, the low level holding module 30 includes the fifth transistor T5 and the seventh transistor T7. The control electrode (i.e. gate) of the fifth transistor T5 and the control electrode (i.e. gate) of the seventh transistor T7 are coupled to the low level holding enable terminal P, and the control electrode (i.e. gate) of the fifth transistor T5 and the second electrode (i.e. source) of the seventh transistor T7 are coupled to low level end. The first electrode (i.e. drain) of the fifth transistor T5 is coupled to control terminal Q. In addition, the first electrode (i.e. drain) of the seventh transistor T7 is coupled to signal output terminal of the shift register unit. Of course, in another embodiment, low level holding enable terminal p and the low level holding enable terminal can be further coupled to the sixth transistor T6. The control electrode (i.e. gate) of the sixth transistor T6 is coupled to drive control terminal, which is used to turn off T5 and T7 in the bootstrapping phase. In other embodiments, there may be other methods to realize low level holding module.

It needs to be explained that, the above mentioned various modules are only used as example for describing the principle of shift register unit. And each module can be realized by previous technical solutions. Therefore, some of the details are not described clearly, the connection method of each module of the shift register unit can be realized by the common technical personnel in this field according to the existing technical scheme. Of course, in the previous technology, in order to realize filtering of noise in the output signal $V_O$ of the signal output of the shift register unit, a capacitor $C_L$ and a resistor $R_L$ can be further coupled to the signal output terminal of the shift register unit, are used for noise filtering.

The signal output of adaptive voltage source 40 is coupled to the enable terminal P of the low level holding module. And the adaptive voltage $V_{DD}$ is provided to enable terminal P of the low level holding module by the adaptive voltage source. The sensing terminal of sensing module 1 is coupled to low level holding enable terminal P, the second terminal of the sensing module 1 is coupled to the control electrode (for example, gate) of the fifth transistor T5 and the second electrode (for example, source) of the seventh transistor T7. Adaptive voltage source sense the threshold voltage of the low level holding module 30 (such as the threshold voltage of the fifth transistor T5 and the seventh transistor T7), the voltage supplied to low level holding enable terminal P can be adjust according to the threshold voltage.

It needs to be explained that, the sensing terminal of the sensing module 1 and the signal output terminal of the adaptive voltage source are coupled to the same electrode of the shift register unit, which is low level holding enable terminal P. In order to avoid the adaptive voltage source being affected by the unstable signal from the shift register unit, an isolation module should be placed between the signal output terminal of the adaptive voltage source and the low level holding enable terminal P.

The isolation module can be realized by capacitance, inductance, mutual inductance or other methods. In a optimized embodiment, the isolation module includes the fourth transistor T4, and the fourth transistor T4 is coupled between the signal output terminal of the adaptive voltage source and the low level holding enable terminal P. Specifically, the second electrode (i.e. source) of the fourth transistor T4 is coupled to low level enable terminal P. The first electrode (i.e. drain) and the control electrode (i.e. gate) are coupled to the signal output of the adaptive voltage source. The adaptive voltage $V_{DD}$ is provided to low level holding enable terminal P through the fourth transistor T4.

Figure 8:
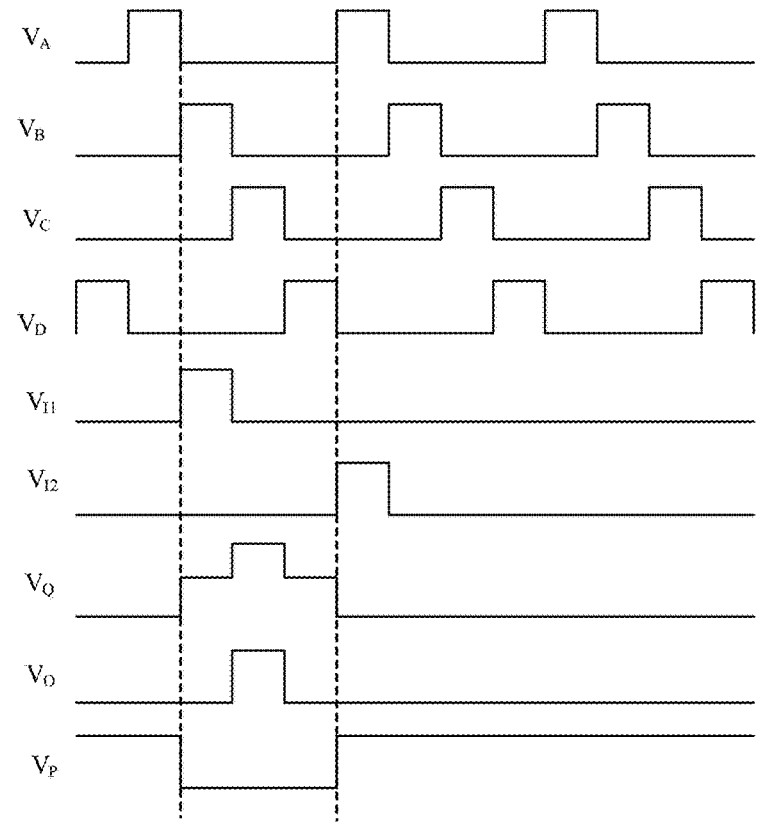
FIG. 8 shows the work sequence diagram of shift register unit circuit of the second examples of this disclosure.

FIG. 8 shows the operating timing diagram of the shift register unit. Among them, $V_A$, $V_B$, $V_C$ and $V_D$ are used to provide the required clock signal to the shift register unit. In an optimized embodiment, the $V_A$, $V_B$, $V_C$ and $V_D$ have the same clock cycle T. In addition, the first clock signal $\varphi 1$ and the second clock signal $\varphi 2$ of the adaptive voltage source can also be provided by the non overlapping signals of the four channels, such as $V_A$ and $V_D$, $V_A$ and $V_C$ and so on. In presented embodiment, voltage source $V_H$ should be kept high at the low level holding phase. $V_H$ can be provided by the external power, and it can also be provided by $V_A$, $V_B$, $V_C$ and $V_D$, or by other ways that can maintain the voltage source $V_H$ at a high level.

The shift register unit starts working at a high level signal in response to the first pulse signal $V_{I1}$, and it enters the low level holding phase when the second pulse signal $V_{I2}$ gets a high level signal. At this time, the shift register unit is in a non-selected state, the voltage $V_P$ of the low-level holding enable terminal is maintained at a high level by the adaptive voltage $V_{DD}$, which is provided by the adaptive voltage source 40 (in this embodiment, $V_P = V_{DD}$). Thus the output signal $V_O$ of the signal output terminal and the potential $V_Q$ of the drive control terminal Q are maintained at low level. In the low level holding phase, the threshold voltage shift of the fifth transistor T5 and the seventh transistor T7 can be sensed by the sensing unit TD3. In the case that the threshold voltage of the fifth transistor T5 and the seventh transistor T7 is increased, the threshold voltage of the sensing unit TD3 is correspondingly increased. Then the equivalent resistance $R_{EQ}$ of TD3 is increased, and the equivalent resistance $R_{12}$ of the switch module 2 is constant. Therefore, the voltage division of sensing unit TD3 makes the adaptive voltage VDD increase accordingly, thus the potential $V_P$ of low level holding enable terminal P is increased. On the contrary, in the case that the threshold voltage of the fifth transistor T5 and the seventh transistor T7 is decreased, the potential $V_P$ of low level holding enable terminal P is increased correspondingly.

The voltage of enabling terminal P of the shift register unit, i.e. $V_P$, can be effectively regulated by the adaptive voltage source. Thus the threshold voltage shift of the transistor in the low-level-holding module can be effectively compensated. Therefore the lifetime of transistor can be prolonged.

Figure 9:
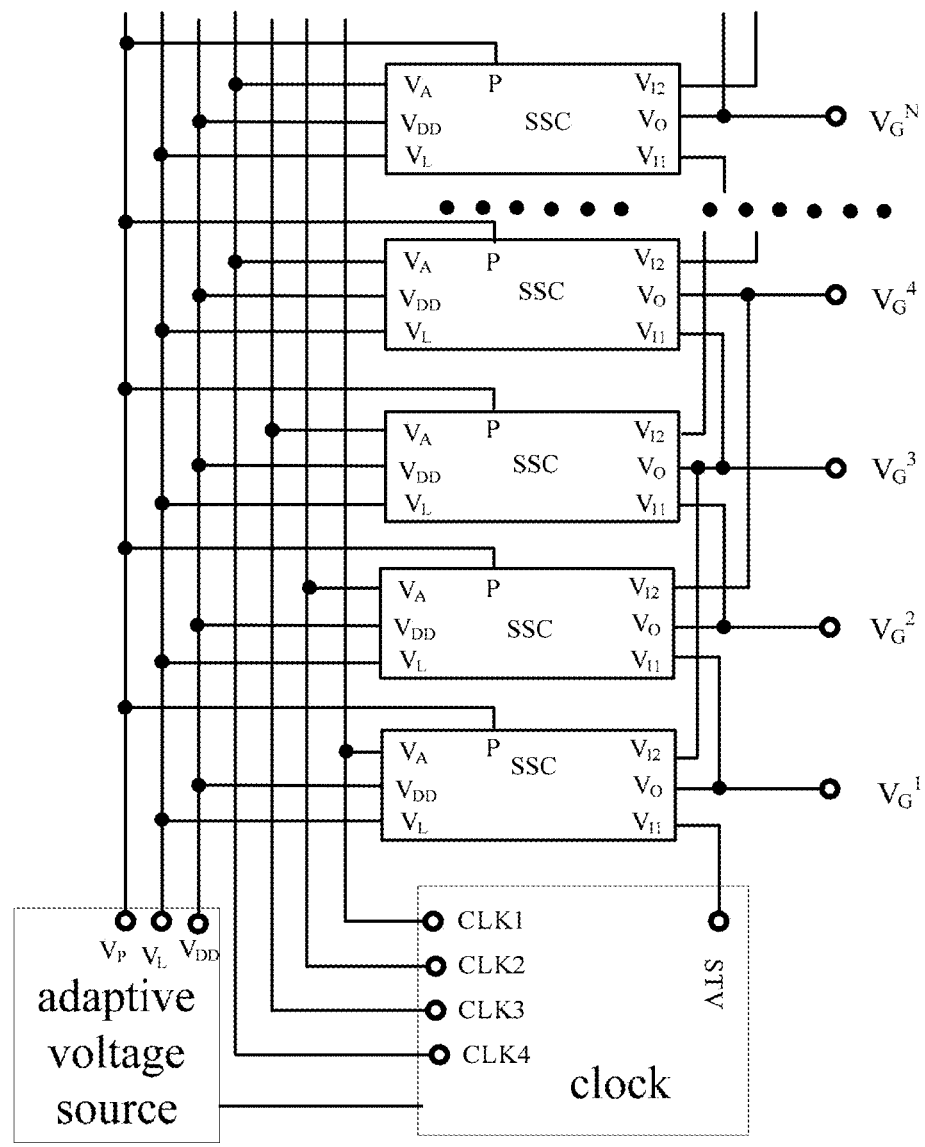
FIG. 9 shows the structure diagram of shift register circuit of the second examples of this disclosure.

Another shift register is disclosed as shown in FIG. 9, the shift register includes multiple shift register units SSC in cascaded connection.

Clock signal required by multiple shift register units are provide by the clock lines (CLK1, CLK2, CLK3 and CLK4).

The start signal line STV is coupled to the first pulse signal input terminal of the first stage of shift-register unit SSC, and the start signal is provided to the first stage of shift-register for triggering to operations.

In an optimized embodiment, the clock signal required by the adaptive voltage source is selectively coupled to the clock line CLK1, CLK2, CLK3 and/or CLK4 through the input terminal of the clock signal. The sensing terminal of the adaptive voltage source is coupled to the enable terminal P of low level holding module of the each stages of shift-register units SSC. And the second end of the sensing module is coupled to low level terminal of all the shift register units SSC. The signal output terminal of the adaptive voltage source is coupled to the enable terminal P of low-level holding modules of each stage of shift-register units. And the output voltage $V_{DD}$ of the adaptive voltage is provided to the enable signal $V_P$ of all the shift register units SSC.

Figure 10:
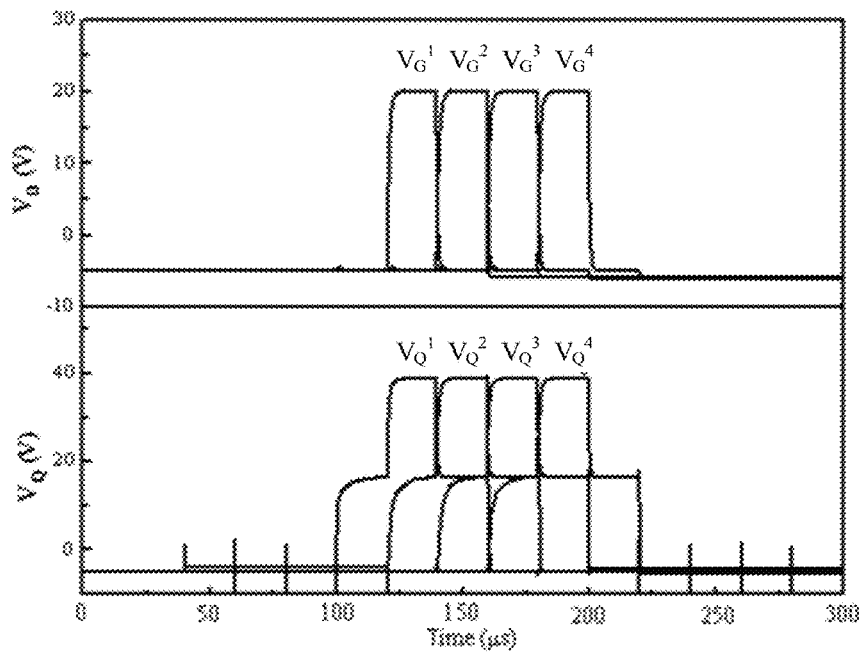
FIG. 10 shows the schematic diagram of simulation results of shift register circuit of the second examples of this disclosure.

In presented embodiment, the adaptive voltage source is shared by all the shift-register units. The reason is that, on one hand, the characteristic uniformity of the amorphous thin film transistors is good. On the other hand, the low level holding transistor of the shift register units SSC experience exactly the same electrical stress conditions. Thus the value of the threshold voltage shift of the low level maintaining transistor of all the shift register units SSC is also highly consistent. Thus only the threshold voltage $V_{TH}$ of the first level shift register unit SSC needs to be extracted, and the exacted $V_{TH}$ information can be shared for the other shift-register units SSC. Thus the circuit structure can be simplified, and the complexity of the circuit and the layout area are reduced. FIG. 10 shows the simulated adaptive compensating results of the shift registers. Among them, the horizontal axis represents the time, and $V_G{}''$ represents the output signal of the n-th shift register unit SSC, and n is a positive integer. $V_Q{}''$ is the potential of the control terminal of the n-th level shift register unit SSC. The function of the adaptive voltage compensation shift register circuit is proved in FIG. 10.

Figure 11:
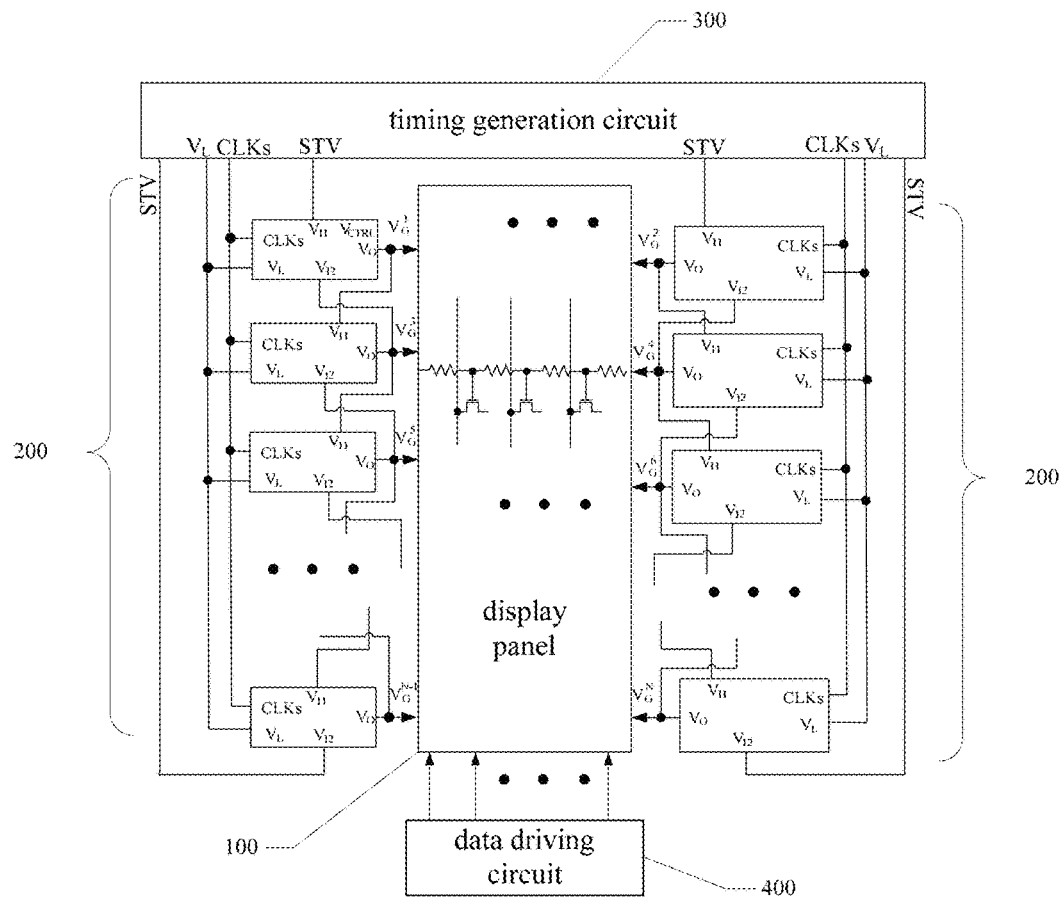
FIG. 11 shows another disclosed display structure diagram of the second examples of this disclosure.
Figure 12:
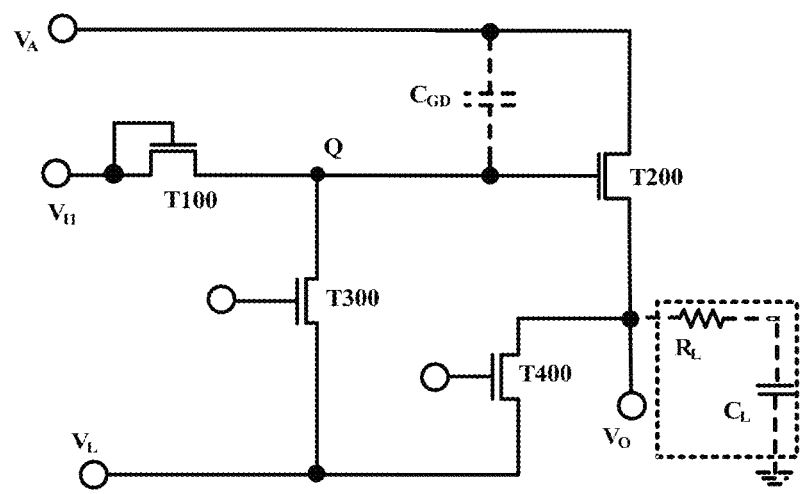
FIG. 12 shows the schematic diagram of the basic structure of shift register unit with normal driving conditions.

A display is disclosed as show in FIG. 11, which includes the display panel 100. And the display panel 100 is comprised by the two-dimensional pixel array, which is composed of plurality of two-dimensional pixels, a plurality of gate scanning lines and data lines which are connected with each pixel in the first direction (i.e. horizontal) and the second direction (i.e. longitudinal) respectively. The same rows of pixels in the pixel array are connected to the same gate scanning line while the same columns of pixels are connected to the same data line. In addition, the display panel 100 can be a liquid crystal display panel, an organic light emitting display panel, an electronic paper display panel. But the corresponding display device can be liquid crystal display, organic light emitting display and electronic paper display and so on.

For the gate driving circuit 200, the gate output scanning signal terminal of the gate drive unit circuit is coupled to gate scanning lines of the display panel 100, and it is used for scanning pixel array progressively. The gate driving circuit 200 can be connected through the welding or integrated with the display panel 100. The gate driving circuit 200 is composed of the shift register as shown in the mentioned embodiments. In a specific embodiment, the gate drive circuit 200 can be arranged on one side of the display panel 100. In an optimized embodiment, a pair of gate driving circuits 200 is used, and which is arranged on both sides of the display panel 100.

The data driving circuit 400 is used for generating the image data signal, which is transferred to corresponding data line of the display panel, and then it is transferred to the corresponding pixel unit by the data line to get the image gray.

Timing generation circuit 300 is used for generating varieties of control signals required by gate drive circuit 200.

Due to the added adaptive voltage source, the disclosed shift register has the following characteristics (1) Gate of the conventional shift register circuit is constantly biased. Due to the fast threshold voltage shift of the low level holding transistors, the circuits are prone to malfunction or have a short lifetime. Due to the added adaptive voltage source, the threshold voltage shift of the transistor can be sensed, and the equivalent resistance $R_{12}$ can be formed using the switch capacitor technique. The gate biasing voltage can be adjusted by the introduced voltage feedback loop, thus the threshold voltage shift of the transistor can be compensated. Therefore the lifetime of the shift register can be prolonged.

(2) Based on the facts that the electrical characteristics of the amorphous thin film transistor is uniform, and the low level holding transistor of all the shift register units experience the same electrical stress, all the shift register units share the adaptive voltage source, thus the circuit structure can be simplified, and power consumption can also be reduced.

(3) For the disclosed shift register circuits of the presented embodiments, the number of the external connections of the display module can be greatly reduced. And no additional voltage lines and control lines are required. Compared to the conventional shift register circuit, the disclosed shift register circuit has the merit of low cost, and improved the circuit reliability.

The above application of specific examples is used to explain the present disclosure. And the presented implementation examples are only used for better comprehension, but the present disclosure is not limited to these examples. The concrete implementation method to realize the proposed scheme can be changed by the technical personnel in this field according to the schematic of the present disclosure.

We claim:

1. An adaptive voltage source, comprising:
    a reference resistance forming circuit and a sensing module (1) connecting between a voltage source ($V_H$) and a low level; wherein:
    the sensing module (1) comprises an sensing terminal which is used for coupling to a sensing transistor (Tx) and sensing a threshold voltage shift of the sensing transistor (Tx) in a circuit, and an equivalent resistance of the sensing module (1) increases with increase of the threshold voltage shift; and
    a signal output terminal is induced by a first node (B) which is a connection of the reference resistance forming circuit and the sensing module, wherein the signal output terminal is used to output an adaptive voltage (VDD) to the circuit.

2. The adaptive voltage source of claim 1, wherein the sensing module (1) comprises an sensing unit (TD3), a control electrode of the sensing unit (TD3) is the sensing terminal of the sensing module (1) which is used to couple to the sensing transistor (Tx) and sense the threshold voltage shift of the sensing transistor (Tx), a first electrode of the sensing unit (TD3) is coupled to the first node (B), and a second electrode of the sensing unit (TD3) is coupled with the low level.

3. The adaptive voltage source of claim 2, wherein the sensing module (1) further comprises a tenth switch transistor (TD10), the control electrode of the sensing unit (TD3) is coupled to a second electrode of the tenth switch transistor (TD10), and a control electrode and a first electrode of the tenth switch transistor (TD10) are coupled and used for coupling to the sensing transistor (Tx) to sense the threshold voltage shift of the sensing transistor (Tx).

4. The adaptive voltage source of claim 1, wherein the sensing module (1) comprises a sensing unit (TD3), an optical coupler (OC), a seventh switch transistor (TD7), a first constant current source and a second constant current source, and wherein:
- a control electrode of the sensing unit (TD3) is the sensing terminal of the sensing module (1) which is used to couple to the sensing transistor (Tx) and sense the threshold voltage shift of the sensing transistor (Tx), a first electrode of the sensing unit (TD3) and a first terminal of the optical coupler (OC) are coupled to the first constant current source, and a second electrode of the sensing unit (TD3) and a second terminal of the optical coupler (OC) are coupled to a low level end;
- a fourth terminal of the optical coupler (OC) and a control electrode of the seventh switch transistor (TD7) are coupled to the second constant current source, and a third terminal of the optical coupler (OC) and a second electrode of the seventh switch transistor (TD7) are coupled to the low level end; and
- a first electrode of the seventh switch transistor (TD7) is coupled to the first node (B).

5. The adaptive voltage source of claim 4, wherein:
the first constant current source comprises an eighth switch transistor (TD8), a first electrode and a control electrode of the eighth switch transistor (TD8) are coupled to a high level end, and a second electrode is coupled to the first electrode of the sensing unit (TD3) and the first terminal of the optical coupler (OC); and/or
the second constant current source comprises a ninth switch transistor (TD9), a first electrode and a control electrode of the ninth switch transistor (TD9) are coupled to the high level, and a second electrode is coupled to the fourth terminal of the optical coupler (OC) and the control electrode of the seventh switch transistor (TD7).

6. The adaptive voltage source of claim 2, wherein the sensing module (1) further comprises a second storage capacity (C2), and the second storage capacity (C2) is cascaded between the first node (B) and the second electrode of the sensing unit (TD3).

7. The adaptive voltage source of claim 2, wherein the sensing unit (TD3) is a transistor.

8. The adaptive voltage source of any one of claim 1, wherein the reference resistance forming circuit is realized by a reference resistance ($R_{ref}$), and one end of the reference resistance ($R_{ref}$) is coupled with the voltage source ($V_H$) and the other end is coupled to the first node (B).

9. The adaptive voltage source of any one of claim 1, wherein:
the reference resistance forming circuit is realized by a switch module (2) which comprises a first switch transistor (TD1), a second switch transistor (TD2) and a first storage capacitor (C1), wherein a control electrode of the first switch transistor (TD1) is used to receive a first clock signal ($\varphi 1$), a first electrode is used to receive the voltage source ($V_H$), and a second electrode is used to couple with a first electrode of the second switch transistor (TD2) to form a second node (A); a control electrode of the second switch transistor (TD2) is used to receive a second clock signal ($\varphi 2$), and a second electrode is coupled to the first node (B); and, one end of the first storage capacitor (C1) is coupled to the second node (A) and the other end is used for coupling to a low level end; and
the first switch transistor (TD1) is conducted corresponding to an active level of the first clock signal ($\varphi 1$) to transfer the voltage source ($V_H$) to the second node (A), the second switch transistor (TD2) is conducted corresponding to an active level of the second clock signal ($\varphi 2$) to couple the first node (B) to the second node (A), and the active level of the first clock signal ($\varphi 1$) does not overlap with the active level of the second clock signal ($\varphi 2$).

10. The adaptive voltage source of claim 9, wherein an adjustment module (3) is further arranged between the first node (B) and the signal output terminal, and wherein:
the adjustment module (3) comprises a fourth switch transistor (TD4), wherein a first electrode of the fourth switch transistor (TD4) is coupled to the second node (A), a second electrode is coupled to the signal output terminal and used for receiving the adaptive voltage ($V_{DD}$), and a control electrode of the fourth switch transistor (TD4) is coupled to the second node (A) or the first node (B).

11. The adaptive voltage source of claim 10, wherein the adaptive module (4) further comprises a filter capacitor (C3), and one end of the filter capacitor (C3) is coupled at the signal output terminal and the other end is used for coupling to the low level end.

12. The adaptive voltage source of claim 11, wherein the adaptive module (4) further comprises a fifth switch transistor (TD5), wherein a control electrode of the fifth switch transistor (TD5) is coupled to the sensing end of the sensing module (1), a first electrode of the fifth switch transistor (TD5) is coupled to the signal output terminal, and a second electrode of the fifth switch transistor (TD5) is coupled to the low level end.

13. A shift register comprising at least one shift register unit, wherein the shift register unit comprises:
- a driving module (20) which is used for transmitting a first signal ($V_A$) to a signal output terminal of the shift register unit in accordance with a switching state to output a scanning signal;
- an input module (10) which is used for controlling the driving module (20) to switch the switching state; and
- a low level holding module which is used to maintain a signal output terminal of the driving module at a low level after the shift register unit outputs the scan signal in accordance with the switching state;

wherein the shift register further comprises an isolation module and an adaptive voltage source of claim 1, and wherein:
the sensing terminal of the adaptive voltage source is connected with a low level holding enable terminal (P) of the low level holding module (30), and the signal output terminal, the isolation module and the low level holding enable terminal (P) are connected in series; and
the adaptive voltage source senses a threshold voltage of the low level maintains module (30) and adjust a supply voltage output to the low level maintain enable (P) according to the threshold voltage.

14. The shift register of claim 13, wherein the isolation module comprises a fourth transistor (TD4), a second electrode of the fourth transistor (TD4) is coupled to the low level holding enable terminal (P), and a first electrode and a control electrode are coupled to the signal output terminal.

15. A display device, comprising:
- a two dimensional pixel array with a plurality of pixels;
- a plurality of data lines in a first direction and a plurality of gate scanning lines in a second direction which are connected with the pixels in the array;
- a data driving circuit which provides data signals for the data lines; and a gate driving circuit which provides gate driving signal for the gate scan lines;

wherein the gate drive circuit comprising the shift register of claim 14.

* * * * *